United States Patent
Nugent

(10) Patent No.: US 9,099,179 B2
(45) Date of Patent: Aug. 4, 2015

(54) THERMODYNAMIC BIT FORMED OF TWO MEMRISTORS

(71) Applicant: KnowmTech, LLC, Albuquerque, NM (US)

(72) Inventor: Alex Nugent, Santa Fe, NM (US)

(73) Assignee: KNOWMTECH, LLC, Santa Fe, NM (US)

( * ) Notice: Subject to any disclaimer, the term of this patent is extended or adjusted under 35 U.S.C. 154(b) by 0 days.

(21) Appl. No.: 14/097,535

(22) Filed: Dec. 5, 2013

(65) Prior Publication Data

US 2014/0192587 A1    Jul. 10, 2014

Related U.S. Application Data

(60) Provisional application No. 61/748,930, filed on Jan. 4, 2013.

(51) Int. Cl.
*G11C 13/00* (2006.01)
*G11C 7/00* (2006.01)

(52) U.S. Cl.
CPC .......... *G11C 13/0033* (2013.01); *G11C 13/004* (2013.01); *G11C 13/0002* (2013.01); *G11C 2213/74* (2013.01)

(58) Field of Classification Search
CPC ............. G11C 13/004; G11C 13/0002; G11C 2213/74
USPC ................... 365/148, 151, 153, 159
See application file for complete search history.

(56) References Cited

U.S. PATENT DOCUMENTS

| | | | |
|---|---|---|---|
| 6,128,214 A | 10/2000 | Kuekes et al. | |
| 6,889,216 B2 | 5/2005 | Nugent | |
| 7,599,895 B2 | 10/2009 | Nugent | |
| 2003/0236760 A1 | 12/2003 | Nugent | |
| 2004/0039717 A1 | 2/2004 | Nugent | |
| 2004/0153426 A1 | 8/2004 | Nugent | |
| 2004/0162796 A1 | 8/2004 | Nugent | |
| 2004/0193558 A1 | 9/2004 | Nugent | |
| 2005/0015351 A1 | 1/2005 | Nugent | |
| 2012/0175583 A1 | 7/2012 | Nugent | |
| 2012/0191438 A1 | 7/2012 | Nugent | |
| 2014/0029328 A1* | 1/2014 | Ribeiro et al. | 365/148 |

* cited by examiner

*Primary Examiner* — Ly D Pham
(74) *Attorney, Agent, or Firm* — Kermit D. Lopez; Luis M. Ortiz; Ortiz & Lopez, PLLC

(57) ABSTRACT

A thermodynamic bit apparatus, method and system. A thermodynamic bit is a device that returns a true or false state with a probability that depends on its internal state, which can be controlled via the application of positive feedback. A thermodynamic bit can include two or more memristors connected in series. A forward bias can be applied to the thermodynamic bit to read the state of the thermodynamic bit. A negative feedback can be applied to the thermodynamic bit during application of a forward bias to the thermodynamic bit. Also, a reverse bias can be applied to the thermodynamic bit to refresh or reinforce the state of the thermodynamic bit.

12 Claims, 1 Drawing Sheet

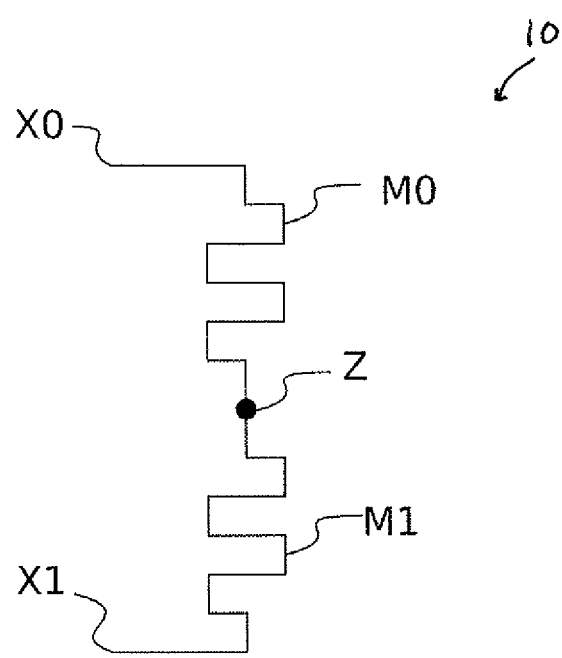

THERMODYNAMIC BIT FORMED OF TWO MEMRISTORS

CROSS-REFERENCE TO PROVISIONAL APPLICATION

This application claims priority under 35 U.S.C. 119(e) to U.S. Provisional Patent Application Ser. No. 61/748,930, entitled "Thermodynamic Bit Formed of Two Memristors," which was filed on Jan. 4, 2013, the disclosure of which is incorporated herein by reference in its entirety.

FIELD OF THE INVENTION

Embodiments generally relate to the fields of neuromorphic integrated circuits, artificial intelligence, deep learning, and thermodynamic computing. Embodiments additionally relate to memristor devices and logic gate components. Embodiments additionally relate to self-assembling and repairing methods and systems. Embodiments also relate to meta-stable devices, such as Knowm™ synapses, switching molecules and switching architectures.

BACKGROUND

A memristor, also sometimes referred to as a "memory resistor," is a passive two-terminal electrical component that can function as a non-linear circuit element relating charge and magnetic flux linkage. When current flows in one direction through the device, the electrical resistance can increase. When current flows in the opposite direction, the resistance can decrease. When the current is stopped, the device retains the last resistance that it had, and when the flow of charge starts again, the resistance of the circuit will be what it was when it was last active. A memristor thus has a regime of operation with an approximately linear charge-resistance relationship as long as the time-integral of the current stays within certain bounds.

Devices based on thermodynamic computing and neuromorphic integrated circuits have been proposed. One example of such a device is the Knowm™ network or system, which is described in a number of U.S. patents and publications. U.S. Pat. No. 6,889,216, entitled "Physical Neural Network Design Incorporating Nanotechnology," which issued to Alex Nugent on May 3, 2005 generally describes a physical neural network that generally includes one or more neuron-like nodes, which are formed from a plurality of interconnected nanoconnections formed from nanoconductors. Such connections constitute Knowm™ connections. Each neuron-like node sums one or more input signals and generates one or more output signals based on a threshold associated with the input signal.

The Knowm™ device physical neural network also includes a connection network formed from the interconnected nanoconnections such that the interconnected nanoconnections used thereof by one or more of the neuron-like nodes are strengthened or weakened according to an application of an electric field, variations in frequency, and so forth. U.S. Pat. No. 6,889,216 is incorporated herein by reference.

Another example of a Knowm™ network or system is described in U.S. Patent Publication No. 2003/0236760, entitled "Multi-layer Training in a Physical Neural Network Formed Utilizing Nanotechnology," by inventor Alex Nugent, which was published on Dec. 25, 2003. U.S. Patent Publication No. 2003/0236760 generally describes methods and systems for training at least one connection network located between neuron layers within a multi-layer physical neural network (e.g., a Knowm™ network or device). The multi-layer physical neural network described in U.S. Patent Publication No. 2003/0236760 can be formed with a plurality of inputs and a plurality outputs thereof, wherein the multi-layer physical neural network comprises a plurality of layers therein such that each layer thereof comprises at least one connection network and at least one associated neuron.

Thereafter, a training wave, as further described in U.S. Patent Publication No. 2003/0236760, can be initiated across one or more connection networks associated with an initial layer of the multi-layer physical neural network which propagates thereafter through succeeding connection networks of succeeding layers of the multi-layer physical neural network by successively closing and opening at least one switch associated with each layer of the multi-layer physical neural network. At least one feedback signal thereof can be automatically provided to each preceding connection network associated with each preceding layer thereof to strengthen or weaken nanoconnections associated with each connection network of the multi-layer physical neural network. U.S. Patent Publication No. 2003/0236760 is incorporated herein by reference.

A further example of a Knowm™ network or system is described in U.S. Patent Publication No. 2004/0039717, entitled "High-density synapse chip using nanoparticles" by inventor Alex Nugent. U.S. Patent Publication No. 2004/0039717 published on Feb. 26, 2004 and generally describes a physical neural network synapse chip (i.e., a Knowm™ chip) and a method for forming such a synapse chip. The synapse or Knowm™ chip can be configured to include an input layer comprising a plurality of input electrodes and an output layer comprising a plurality of output electrodes such that the output electrodes are located perpendicular to the input electrodes. A gap is generally formed between the input layer and the output layer.

A solution can then be provided which is prepared from a plurality of nanoconductors and a dielectric solvent. The solution is located within the gap such that an electric field is applied across the gap from the input layer to the output layer to form nanoconnections of a physical neural network implemented by the synapse chip. Such a gap can thus be configured as an electrode gap. The input electrodes can be configured as an array of input electrodes, while the output electrodes can be configured as an array of output electrodes. U.S. Patent Publication No. 2004/0039717 is also incorporated herein by reference.

A further example of a Knowm™ network or system is disclosed in U.S. Patent Publication No. 2004/0153426, entitled "Physical Neural Network Liquid State Machine Utilizing Nanotechnology," by inventor Alex Nugent, which was published on Aug. 5, 2004. U.S. Patent Publication No. 2004/0153426 generally discloses a physical neural network (i.e., a Knowm™ network), which functions as a liquid state machine.

The physical neural network described in U.S. Patent Publication No. 2004/0153426 can be configured from molecular connections located within a dielectric solvent between pre-synaptic and post-synaptic electrodes thereof such that the molecular connections are strengthened or weakened according to an application of an electric field or a frequency thereof to provide physical neural network connections thereof. A supervised learning mechanism is associated with the liquid state machine, whereby connections strengths of the molecular connections are determined by pre-synaptic and post-synaptic activity respectively associated with the pre-synaptic and post-synaptic electrodes, wherein the liquid state machine comprises a dynamic fading memory mechanism. U.S. Patent Publication No. 2004/0153426 is also incorporated herein by reference.

A further example of a Knowm™ network or system is disclosed in U.S. Patent Publication No. 2004/0162796, entitled "Application of Hebbian and anti-Hebbian Learning to Nanotechnology-based Physical Neural Networks" by inventor Alex Nugent, which published on Aug. 19, 2004. U.S. Patent Publication No. 2004/0162796 generally discloses a physical neural network (i.e., Knowm™ network) configured utilizing nanotechnology. The Knowm™ network disclosed in U.S. Patent Publication No. 2004/0162796 includes a plurality of molecular conductors (e.g., nanoconductors) which form neural connections between pre-synaptic and post-synaptic components of the physical neural network.

An alternative example of a nanoscale meta-stable switching element is the cross bar architecture. A molecular cross bar memory is disclosed, for example, in U.S. Pat. No. 6,128, 214 entitled "Molecular Wire Crossbar Memory" which issued to Kuekes et al. on Oct. 3, 2000. Kuekes et al. disclose a memory device that is constructed from cross bar arrays of nanowires sandwiching molecules that act as on/off switches. The device is formed from a plurality of nanometer-scale devices, each device comprising a junction formed by a pair of crossed wires where one wire crosses another and at least one connector species connects the pair of crossed wires in the junction. The connector species comprises a bi-stable molecular switch. The junction forms either a resistor or a diode or an asymmetric non-linear resistor. The junction possesses a state that is capable of being altered by application of a first voltage and sensed by the application of a second, non-destructive voltage. A series of related technology attempts to convert everything from molecular logic to how to chemically assemble these devices.

Such a molecular cross bar device has two general applications. The notion of transistors built from nanotubes and relying on nanotubes properties is being pursued. In this manner, computational systems can be constructed. Second, two wires can be selectively brought to a certain voltage and the resulting electrostatic force attracts them. When the wires touch, the Van der Waals force maintains the wires in contact with one another such that a "bit" is stored. The connections in such an apparatus can therefore be utilized with standard electronic circuitry.

One aspect of the cross bar architecture, which deserves some illumination, is its potential unreliability. The device functions by creating a physical system with one meta-stable state, which is formed from the balance of Van der Waals intermolecular attraction and a mechanical tension from a bent nanowire. The Van der Waals force must be made sufficient to oppose the mechanical strain. The construction of such a device preferably utilizes a nanowire suspended above a lower nanotube (or other nanoparticle) or electrical contact. The further apart the supports, the less of a force required to bend the nanowire. This has an interesting consequence when the system in scaled down.

As the switch density is increased, the support distance must necessarily decrease. This causes the force from mechanical strain to increase. One possible solution would be to place the nanowires closer together so that less of a deflection is needed to make contact. There is an absolute distance, however, for which the nanowires cannot be brought closer and this distance is set by quantum mechanical electron tunneling. In this manner, it can be seen that as the device is scaled down, the potential energy well formed from the Van der Waals force becomes weakened as the mechanical strain from the bent nanowire increases. This results in the connection having an increased probability of falling into the "ground state".

Alternately, switching molecules have been found that can be configured to be in a conducting and a non-conducting state. To date, one problem with such molecules is that the states are only meta-stable, particularly one of the states. After a short time, which usually decreases as the temperature is increased, the state is lost. If the "on" state represents a conducting state, then this naturally raises the question, "how does one work with an unreliable connection?". It is the purpose of this disclosure to apply a type of local interaction so as to work with an unreliable connection, or alternately to constantly repair a connection if it undergoes a transition from a meta-stable to a ground state. This methodology can be used in, for example, Knowm™ connection networks, nanowire cross junctions, and meta-stable switching molecules such as rotoxane. The methodology has been first described for Knowm™ connection networks and its extension to other nanoscale implementations is unexpected. In all cases, we can refer to pre- and post-synaptic electrodes, where a Knowm™ connection, nanowire junction, switching molecule, quantum tunneling transistor, and the like forms the pre-to-post electrode switching contact. In all cases, the device is configured to work with a meta-stable nanoscale switch, which we will describe in detail and offer examples.

A local feedback mechanism can be applied, which implements Hebbian and anti-Hebbian learning. Such a learning mechanism can utilize a voltage gradient or voltage gradient dependencies to implement Hebbian and/or anti-Hebbian (AHAH) plasticity. The learning mechanism can also utilize pre-synaptic and post-synaptic frequencies to provide Hebbian and/or anti-Hebbian learning within the physical neural network. U.S. Patent Publication No. 2004/0162796 is incorporated herein by reference.

An additional example of a Knowm™ network or device is disclosed in U.S. Patent Publication No. 2004/0193558, entitled "Adaptive Neural Network Utilizing Nanotechnology-based Components" by Alex Nugent, which published on Sep. 30, 2004. U.S. Patent Publication No. 2004/0193558 generally describes methods and systems for modifying at least one synapse of a physical neural network (i.e., a Knowm™ network). The physical neural or Knowm™ network described in U.S. Patent Publication No. 2004/0193558 can be implemented as an adaptive neural network, which includes one or more neurons and one or more synapses thereof.

The synapses are formed from a plurality of nanoparticles disposed within a dielectric solution in association with one or more pre-synaptic electrodes and one or more post-synaptic electrodes and an applied electric field. Alternately, the synapses are formed from a plurality of nanowire cross junctions formed from two or more nanowires composed of, for example, carbon nanotubes and forming one or more pre-synaptic electrodes and one or more post-synaptic electrodes. Alternately, the synapses are formed from a plurality of switching molecules formed from one or more molecule of, for example, Rotoxane, preferably located between two or more pre- and post-synaptic electrodes comprising, for example, carbon nanotubes or photolithography defined and patterned electrodes.

At least one electric pulse can be generated from one or more of the neural circuit modules to one or more of the pre-synaptic electrodes of a succeeding neuron and one or more post-synaptic electrodes of one or more of the neurons of the synapse junction, thereby strengthening at least one nanoparticle of a plurality of nanoparticles disposed within the dielectric solution and at least one synapse thereof. At least one electric pulse can be generated from one or more of the neural circuit modules to one or more of the pre-synaptic electrodes of a succeeding neuron and one or more post-synaptic electrodes of one or more of the neurons of the synapse junction, thereby configuring the state of at least one meta-stable switch of a plurality of meta-stable switches disposed within the dielectric solution and at least one synapse thereof. U.S. Patent Publication No. 2004/0193558 is incorporated herein by reference.

Another example of a Knowm™ network or device is disclosed U.S. Patent Publication No. 2005/0015351, entitled "Nanotechnology Neural Network Methods and Systems" by inventor Alex Nugent, which published on Jan. 20, 2005. U.S. Patent Publication No. 2005/0015351 generally discloses a physical neural network (i.e., a Knowm™ network), which constitutes a connection network comprising a plurality of molecular conducting connections suspended within a connection gap formed between one or more input electrodes and one or more output electrodes. One or more molecular connections of the molecular conducting connections can be strengthened or weakened according to an application of an electric field, frequency, and the like across the connection gap.

The notion of a connection network can be applied to a nanoscale architecture of the cross bar array. Rather than a Knowm™ synapse forming a connection at the intersection of the cross bar, the connection is formed by the mechanical contact of the electrodes themselves, which are implemented as nanowires. When two wires are raised to opposing voltages, columbic attraction brings the wires together. Charging the wires can be used to overcome the Van der Waals attractive force and allows the mechanical strain to bring the nanowire to its ground state. The same self-organizing principles that were developed for a Knowm connection can be applied to an unreliable cross-bar electrode junction.

The notion of a connection network can be applied to a nanoscale switching molecule architecture. Rather than a Knowm™ synapse forming a connection at the intersection of the cross bar, the connection is formed by one or more switching molecules composed of, but not limited to, Rotoxane. In general, all that is required is a two-state system, where an impedance change can be measured between the two states. In addition, it is preferable that one of the states is unstable and has a non-zero probability of transition to the ground state. When two wires are raised to opposing voltages, an electric field is generated that switches the molecules into the meta-stable state. The same self-organizing principles that were developed for a Knowm connection can be applied to a meta-stable switching molecule architecture.

An example of meta-stable switching is disclosed in U.S. Pat. No. 7,599,895, entitled "Methodology for the Configuration and Repair of Unreliable Switching Elements," which issued on Oct. 6, 2009 to Alex Nugent, which is incorporated herein by reference in its entirety.

An example of a memristor device that utilizes meta-stable switching devices is disclosed in U.S. Patent Application Publication No. 2012/0175583, entitled "Memristor Apparatus" by inventor Alex Nugent, which published on Jul. 12, 2012 and is incorporated herein by reference in its entirety. An example of a thermodynamic computing architecture with self-organizing and adaptive control systems is disclosed U.S. Patent Application Publication No. 2012/0191438, entitled "Methods and Systems for Thermodynamic Evolution" by inventor Alex Nugent, which published on Jul. 26, 2012.

As transistor densities on modern integrated electronic chips increase, there is a growing trend toward reconfigurable architectures. Rather than implementing application specific integrated circuits (ASIC), it is preferred that a design be deployed on programmable logic devices. The move in such a direction is creating a growing trend toward an IP-based development process, where circuits are defined by their programming routine rather than the actual physical layout. Rather than implementing a program to run on a processor, for example, a chip may process a program to build the processor.

In view of the foregoing developments in thermodynamic computing and the need for reconfigurable architectures, it is believed that one solution toward creating such technology involves the implementation of improved memristor devices, systems, and components.

SUMMARY

The following summary is provided to facilitate an understanding of some of the innovative features unique to the embodiments and is not intended to be a full description. A full appreciation of the various aspects of the embodiments can be gained by taking the entire specification, claims, drawings, and abstract as a whole.

It is, therefore, one aspect of the disclosed embodiments to provide for a memristor apparatus.

It is another aspect of the disclosed embodiments to provide for a thermodynamic bit formed of two memristors.

It is a further aspect of the disclosed embodiments to provide for a thermodynamic bit composed of two (or more) memristors connected in series.

It is also an aspect of the disclosed embodiments to apply a forward bias to such a thermodynamic bit to read its state.

It is an additional aspect of the disclosed embodiments to apply a negative feedback to such a thermodynamic bit during application of a forward bias.

It is yet another aspect of the disclosed embodiments to apply a reverse bias to such a thermodynamic bit to refresh or reinforce its state.

The above and other aspects can be achieved as is now described. A thermodynamic bit, including an apparatus, method, and system thereof, is disclosed herein. A thermodynamic bit is a device that returns a true or false state with a probability that depends on its internal state, which can be controlled via the application of positive feedback. A thermodynamic bit can include two or more memristors connected in series. A forward bias can be applied to the thermodynamic bit to read the state of the thermodynamic bit. A negative feedback can be applied to the thermodynamic bit during application of a forward bias to the thermodynamic bit. Also, a reverse bias can be applied to the thermodynamic bit to refresh or reinforce the state of the thermodynamic bit.

BRIEF DESCRIPTION OF THE FIGURES

FIG. 1 illustrates a schematic diagram of a thermodynamic bit, which can be implemented in accordance with a preferred embodiment.

DETAILED DESCRIPTION

The particular values and configurations discussed in these non-limiting examples can be varied and are cited merely to illustrate one or more embodiments.

FIG. 1 illustrates a schematic diagram of a thermodynamic bit 10, which can be implemented in accordance with a preferred embodiment. The thermodynamic bit 10 is a device that returns a true or false state with a probability that depends on its internal state, which can be controlled via the application of positive feedback. When deprived of feedback, the thermodynamic bit will flip its state from false (negative, 0, etc.) to true (positive, 1, etc.) or true to false with a probability that approaches ½. Unlike typical bits, thermodynamic bits are capable of configuring themselves provided that the stabilizing or feedback signal is provided. Many configurations of thermodynamic bits are possible. We disclose an extremely compact thermodynamic bit formed of two memristors.

For the disclosed thermodynamic bit to function, it must be the case that the memristive devices (M0 and M1) are polar. This means that application of a forward bias causes the devise to increase in conductance while a reverse bias will cause them to decrease in conductance.

Let us define a forward bias as a voltage input where $V(X0) > V(X1)$ and a reverse bias where $V(X0) < V(X1)$. During the application of a forward bias, a voltage $V(Z)$ will be present on Z. Let us define the thermodynamic bit's true output state to be when $V(Z) > (V(X0) - V(X1))/2$ and the false output state as being $V(Z) < (V(X0) - V(X1))/2$.

During a read operation, the output state is determined. Because the memristors M0 and M1 are adapting during the application of the forward bias, one may say that the output state is damaged. This is because the memristive device, which had the higher conductance will have a smaller voltage drop across it during the application of the forward bias than the device that has the lower conductance. After repeated read operations, one can see how the thermodynamic bit will evolve to a state such that it will evaluate true or false with a probability of ½.

To stabilize the bits output state, a reverse bias can be applied. In this case, note that the larger voltage drop will be across the devise with the lower conductance. However, the conductance of lower conductance device will be reduced faster than the higher conductance device. Stated differently, the thermodynamic bit's state will undergo positive feedback during application of the reverse bias. If the thermodynamic bit was in a true or positive state at the end of the read operation, then a reverse bias will cause the state to converge deeper into the positive state.

We may thus see a forward bias as a "read" operation that causes negative feedback and a reverse bias as a "refresh" operation that causes positive feedback.

The reverse bias accomplishes more than simply positive feedback, however. To prevent the memristive devices M0 and M1 from saturating in their high conductance state, a reverse bias may be applied to lower their conductance. The reverse bias is therefore important for these two reasons.

The operation of the thermodynamic bit thus proceeds as follows. The output state of the bit is read and its value used for a computation. If feedback is desired, then a reverse bias is applied. In such a way, a thermodynamic bit may configure itself based on stabilizing feedback. Although, this might seem like an inefficient way to configure a bit, one must keep in mind that many bits may configure themselves at the same time with one or multiple feedback signals.

Based on the foregoing, a number of embodiments, alternative and preferred are disclosed herein. For example, in one embodiment a thermodynamic bit apparatus can include a thermodynamic bit comprising at least two memristors connected in series. In another embodiment, a forward bias can be applied to the thermodynamic bit to read a state of the thermodynamic bit. In yet another embodiment, a negative feedback can be applied to the thermodynamic bit during an application of a forward bias to the thermodynamic bit. In still another embodiment, a reverse bias can be applied to the thermodynamic bit to refresh or reinforce a state of the thermodynamic bit.

In another embodiment, a forward bias can be applied to the thermodynamic bit to read a state of the thermodynamic bit; and a negative feedback can be applied to the thermodynamic bit during an application of the forward bias. In yet another embodiment, a negative feedback can be applied to the thermodynamic bit during an application of a forward bias to the thermodynamic bit; and a reverse bias can be applied to the thermodynamic bit to refresh or reinforce a state of the thermodynamic bit. In other embodiments, a forward bias can be applied to the thermodynamic bit to read a state of the thermodynamic bit; a negative feedback can be applied to the thermodynamic bit during an application of the forward bias; and a reverse bias can be applied to the thermodynamic bit to refresh or reinforce the state of the thermodynamic bit. In still another embodiment, the at least two memristors can include at least one meta-stable switching element.

In still another embodiment, a method of configuring a thermodynamic bit can be implemented. Such a method can include the step or logical operation of, for example, connecting at least two memristors in series to comprise a thermodynamic bit. In another embodiment, a step or logical operation can be implemented for applying a forward bias to the thermodynamic bit to read a state of the thermodynamic bit. In yet another embodiment, a step or logical operation can be implemented for applying a negative feedback to the thermodynamic bit during an application of a forward bias to the thermodynamic bit. In another embodiment, a step or logical operation can be implemented for applying a reverse bias to the thermodynamic bit to refresh or reinforce a state of the thermodynamic bit.

In other embodiments, steps or logical operations can be provided for applying a forward bias to the thermodynamic bit to read a state of the thermodynamic bit; and applying a negative feedback to the thermodynamic bit during an application of the forward bias. In yet another embodiment, steps or logical operations can be provided for applying a negative feedback to the thermodynamic bit during an application of a forward bias to the thermodynamic bit; and applying a reverse bias to the thermodynamic bit to refresh or reinforce a state of the thermodynamic bit. In still other embodiments, steps or logical operations can be provided for applying a forward bias to the thermodynamic bit to read a state of the thermodynamic bit; applying a negative feedback to the thermodynamic bit during an application of the forward bias; and applying a reverse bias to the thermodynamic bit to refresh or reinforce the state of the thermodynamic bit. In another embodiment, the at least two memristors can constitute at least one meta-stable switching element.

In another embodiment, a thermodynamic bit system can be implemented, which includes a thermodynamic bit comprising at least two memristors connected in series, wherein the at least two memristors comprise a plurality of meta-stable switching elements. In other embodiments, a forward bias can be applied to the thermodynamic bit to read a state of the thermodynamic bit. In yet other embodiments, a negative feedback can be applied to the thermodynamic bit during an application of a forward bias to the thermodynamic bit. In still other embodiments, a reverse bias can be applied to the thermodynamic bit to refresh or reinforce a state of the thermodynamic bit.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A thermodynamic bit apparatus, comprising:
a thermodynamic bit comprising at least two memristors connected in series;
wherein a forward bias is applied to said thermodynamic bit to read a state of said thermodynamic bit; and
a negative feedback to said thermodynamic bit results from application of said forward bias.

2. The apparatus of claim 1 wherein:
said negative feedback response to said thermodynamic bit during an application of said forward bias to said thermodynamic bit; and
a reverse bias is applied to said thermodynamic bit to refresh or reinforce a state of said thermodynamic bit.

3. The apparatus of claim 1 wherein at least one of said at least two memristors comprises at least one meta-stable switching element.

4. A method of configuring a thermodynamic bit, said method comprising:
connecting at least two memristors in series to comprise a thermodynamic bit;
applying a forward bias to said thermodynamic bit to read a state of said thermodynamic bit; and
a resulting negative feedback response to said thermodynamic bit from application of said forward bias.

5. The method of claim 4 further comprising:
achieving said negative feedback to said thermodynamic bit via the application of a forward bias to said thermodynamic bit; and
applying a reverse bias to said thermodynamic bit to refresh or reinforce a state of said thermodynamic bit.

6. The method of claim 4 wherein at least one of said at least two memristors comprises at least one meta-stable switching element.

7. A thermodynamic bit system, comprising:
a thermodynamic bit comprising at least two memristors connected in series, wherein at least one of said at least two memristors comprises a plurality of meta-stable switching elements wherein a negative feedback response to said thermodynamic bit results from an application of a forward bias to said thermodynamic bit.

8. The system of claim 7 wherein a forward bias is applied to said thermodynamic bit to read a state of said thermodynamic bit.

9. The system of claim 7 wherein a reverse bias is applied to said thermodynamic bit to read a state of said thermodynamic bit.

10. The system of claim 7 wherein a reverse bias is applied to said thermodynamic bit to refresh or reinforce a state of said thermodynamic bit.

11. The system of claim 8 wherein a reverse bias is applied to said thermodynamic bit to refresh or reinforce a state of said thermodynamic bit.

12. The system of claim 7 wherein:
a forward bias is applied to said thermodynamic bit to read a state of said thermodynamic bit; and
a reverse bias is applied to said thermodynamic bit to refresh or reinforce a state of said thermodynamic bit.

* * * * *